(12) United States Patent
Mayer et al.

(10) Patent No.: US 6,879,206 B2
(45) Date of Patent: Apr. 12, 2005

(54) DISABLER CIRCUIT

(75) Inventors: Brian C. Mayer, Nampa, ID (US);
Daniel J. Martin, Boise, ID (US);
Edward Michael Wood, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/452,594

(22) Filed: Jun. 2, 2003

(65) Prior Publication Data

US 2004/0239405 A1 Dec. 2, 2004

(51) Int. Cl.[7] .............................................. H01H 37/76
(52) U.S. Cl. ...................... 327/525; 327/427; 365/225.7
(58) Field of Search ................................ 327/524–526, 327/403, 404, 427, 581; 365/46, 225.7; 347/50, 57–59; 399/148, 364; 355/24

(56) References Cited

U.S. PATENT DOCUMENTS 6,121,820 A * 9/2000 Shishikura ................... 327/525
6,462,609 B2 * 10/2002 Hashimoto et al. ......... 327/525
2002/0003483 A1 * 1/2002 Hashimoto et al. ......... 341/121

* cited by examiner

*Primary Examiner*—Long Nguyen

(57) ABSTRACT

A disabler circuit is disclosed for disabling a function of a device. The disabler circuit includes a switch electrically coupled to an input voltage and to ground. The disabler circuit further includes a fuse electrically coupled a series with the switch between the input voltage and ground. The disabler circuit also includes a resistor electrically coupled and parallel with the switch and in series with the fuse between the input voltage and ground. If the switch is off, then current flows from the input voltage to ground through the resistor and the fuse and the current is too small to blow the fuse. If the switch is on, then current flows from the input voltage to ground through the switch and the fuse and is large enough to blow the fuse. In specific embodiment, the disabler circuit is part of a formatter in a printer to disable a duplexing function of the printer.

16 Claims, 1 Drawing Sheet

DISABLER CIRCUIT

BACKGROUND OF THE INVENTION

1. Field of the Invention

This invention relates generally to a disabler circuit that disables a function of a device and, more particularly, by way of example, to a disabler circuit employing a fuse that can be selectively blown during the production phase of a device so as to disable a particular function of the device, such as a duplexing function of a printer.

2. Discussion of the Related Art

State of the art work group printers are complicated machines that are able to perform various printer related functions. For example, the Hewlett Packard 4600 series LaserJet® printers employ several layers of hardware and software for controlling the operation of the printer. The printer includes a printer engine that performs the printing operation. The printer engine includes an embedded formatter that provides the printer control and management operations. A boot strap loader (BSL) is also provided within the formatter that initiates the boot process at printer start-up in a manner that is well understood in the art. The BSL is firmware resident on a read only memory (ROM) of the formatter and supports the Peripheral Management Language (PML), which is used to provide device settings management. An input/output (I/O) application specific integrated circuit (ASIC) is also provided that performs input and output operations between the formatter, BSL, PML and the computer and other peripheral devices that the printer may be connected to.

Certain printer models, such as the LaserJet® 4600 series printers, employ a duplexing function built into the printer engine that allows the printer engine to print on both sides of a sheet of paper. The duplexing feature is a high-end option for laser printers of this type, and is not available on all models. Thus, those models that are able to perform the duplexing function, and other high level functions, are typically more expensive than other models that are not capable of performing these functions because of their ability to provide more features.

The models that do provide the duplexing function typically use a different formatter than those models that do not provide the duplexing function to allow for this difference in functionality. Because different formatters are required, there is added expense to the printer and it's manufacturing process that otherwise would not be required if a single formatter was able to be used for both models that did and didn't provide the built-in duplexing function. For example, the different formatters need to be stocked at the production facility and at the service facility, and need to be specifically identified. Also, the service personnel must know which printers do and don't have the duplexing function, and which formatter goes with the particular printer.

SUMMARY OF THE INVENTION

A disabler circuit is disclosed for disabling a function of a device. The disabler circuit includes a switch and a fuse electrically coupled in series between an input voltage and ground. The disabler circuit further includes a resistor electrically coupled in parallel with the switch and in series with the fuse between the input voltage and ground. If the switch is off, then current flows from the input voltage to ground through the resistor and the fuse, and the current is too small to blow the fuse. If the switch is on, then current flows from the input voltage to ground through the switch and the fuse, and the current is large enough to blow the fuse. In one specific embodiment, the disabler circuit is part of a formatter in a printer to disable a duplexing function of the printer.

DETAILED DESCRIPTION OF THE EMBODIMENTS

Figure 1:
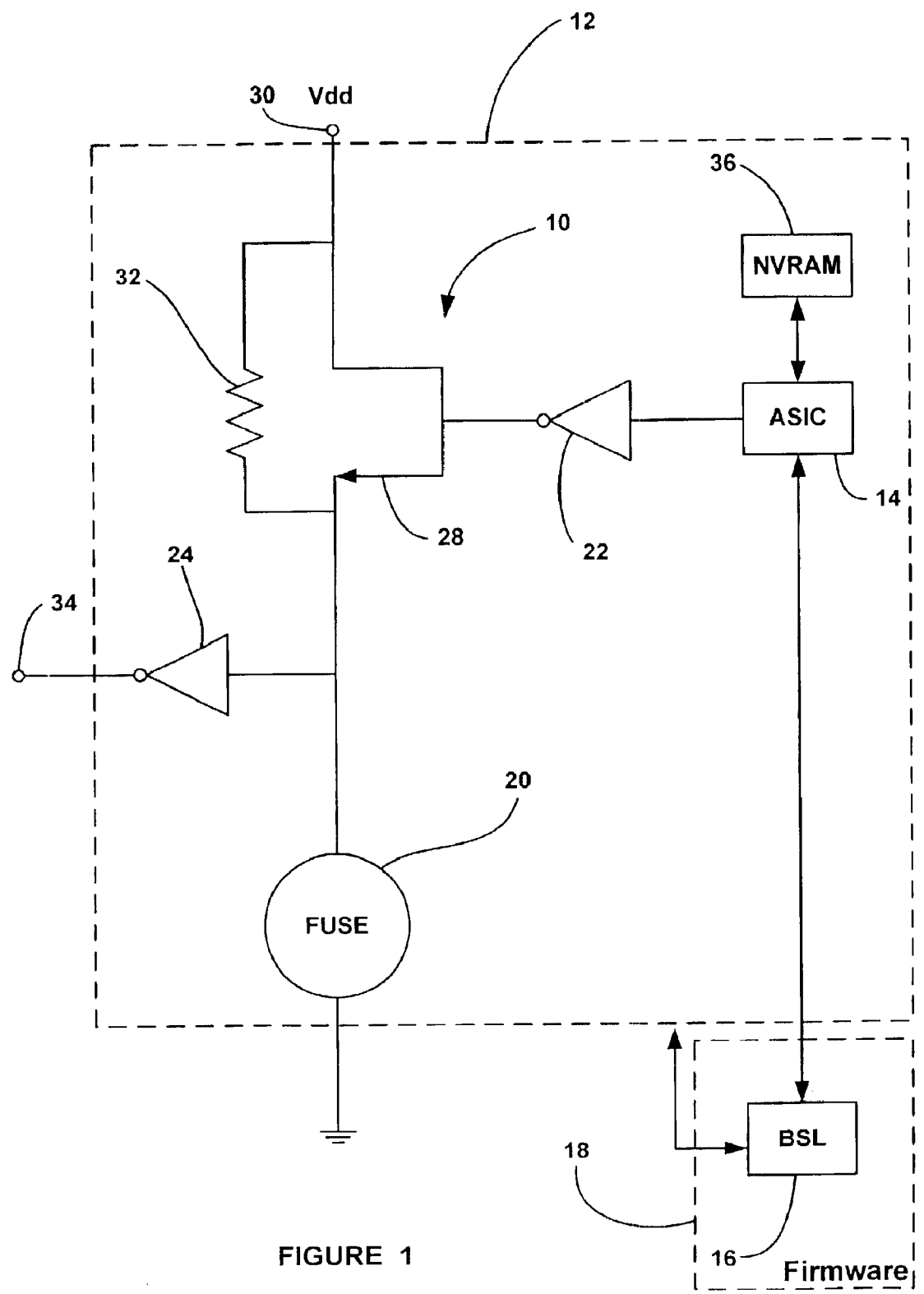
FIG. 1 is a schematic diagram of a disabler circuit for disabling a device function, such as a duplexing function of a printer, according to an embodiment of the present invention.

The following discussion of the embodiments of the invention directed to a disabler circuit for disabling a function of a device is merely exemplary in nature, and is in no way intended to limit the invention, or its application or uses. Particularly, the discussion below will describe the disabler circuit of the invention for disabling a duplexing function of a printer. However, the disabler circuit of the present invention has application for disabling other features of other devices, as will be appreciated by those skilled in the art.

FIG. 1 is a schematic diagram of a disabler circuit 10 that is part of a formatter 12 in a printer engine associated with a printer, such as a Hewlett Packard 4600 laser jet printer. The formatter 12 includes an ASIC 14 operating as a general purpose I/O device that controls the parallel input and output ports of the printer, and is of the type well known to those skilled in the art. The formatter 12 must implement the circuit 10 and connect it to the standard I/O lines of the ASIC 14. The printer also includes a BSL 16 provided within firmware 18 that controls the boot up process of the formatter 12 at printer start-up. The basic operation of a formatter, I/O ASIC and BSL of this type in a printer is well understood to those skilled in the art.

According to the embodiment shown in FIG. 1, the disabler circuit 10 employs a fuse 20 that provides an open circuit or closed circuit to disable or enable a duplexing function of the printer, as will be discussed in detail below. An input inverter 22 and an output inverter 24 are used to invert a logic zero or a logic one input and output, respectively, of the circuit 10 to make it compatible with existing I/O ASICs currently being used in the 4600 series printers. The output of the input inverter 22 is coupled to the gate terminal of an N-doped field effect transistor (FET) switch 28. As will be appreciated by those skilled in the art, other transistor switches and non-transistor switches suitable for the purpose described herein can be used in place of the switch 28 within the scope of the present invention.

The source terminal of the FET switch 28 is electrically coupled to a node 30 that is electrically coupled to a voltage source Vdd. The drain terminal of the FET switch 28 is electrically coupled to the input of the output inverter 24 and one side of the fuse 20. The other side of the fuse 20 is coupled to ground so that the FET switch 28 and the fuse 20 are electrically connected in series. A bypass pull-up resistor 32 is electrically coupled in parallel with the FET switch 28 across its source and drain terminals, as shown. Thus, the resistor 32 and the fuse 20 are also electrically coupled in series. An output port 34 electrically coupled to the output of the output inverter 24 is coupled to one of the read I/O ports of the ASIC 14, although not particularly shown in FIG. 1.

The initial state of the input to the input inverter 22 is a logic one (high voltage). The inverter 22 inverts the logic one to a logic zero (low voltage), and thus, the voltage applied to the gate terminal of the FET switch 28 is low preventing it from conducting. Therefore, the current flow from the node 30 to ground travels through the pull-up resistor 32 and the fuse 20. The value of the resistor 32 is selected to limit the current flow through the fuse 20 so that it will not be blown when the FET switch 20 is not conducting or is off. Because the resistance of the fuse 20 is much less than the resistance of the resistor 32, the voltage potential at the drain terminal of the FET switch 28 will be close to ground or a logic zero. Thus, the output of the output inverter 24 at the port 34 will be a logic one. The BSL 16 will receive the logic one output from the disabler circuit 10 and know that the duplexing function should be enabled or operational.

To disable the duplexing function, a line technician making the printer during production will initiate a programming sequence through the BSL 16 to cause the ASIC 14 to send a logic zero to the input inverter 22. The inverter 22 will invert the logic zero and provide a logic one to the gate terminal of the FET switch 28 to cause it to conduct. Therefore, current from the voltage source to ground will travel through the low resistance path of the FET switch 28 and not the high resistance path of the resistor 32. The fuse 20 is selected so that this amount of current will cause it to be blown. When the fuse 20 is blown, the resistor 32 will take over causing the voltage at the drain terminal of the FET switch 28 to be high or a logic one.

The output inverter 24 will invert the logic one to a logic zero at the output port 34. Further, the formatter 12 will write a value into an NVRAM 36 within the formatter 12 indicating the fuse 20 has been blown. The NVRAM 36 is modified from the conventional layout to provide enough space to store the indication that the fuse 20 has been blown. During normal start-up of the printer when it is being used for printing and the fuse 20 has previously been blown, the ASIC 14 will route the logic zero at the port 34 to the BSL 16. The BSL 16 will read this value and cause the duplexing function to be disabled as the printer is booting up.

Disabling the duplexing function is intended to be permanent at the manufacturing level of the printer. Thus, a single formatter 12 including the disabler circuit 10 can be provided for both models of printers that are intended to employ the duplexing function and those that aren't.

Certain steps can be taken to insure that the duplexing function remains disabled in those models where the fuse 20 has been blown. If a user attempts to circumvent the blown fuse 20 by replacing it or otherwise to enable the duplexing function, the BSL 16 will detect the presence of a new fuse. The BSL 16 will have previously received the value written into the NVRAM 36 indicating the fuse 20 is blown, and thus will know that an unauthorized attempt to enable the duplexing function has been attempted. The BSL 16 can then go through the process of blowing the fuse 20 again, as discussed above. Further, the BSL 16 needs to access the NVRAM 36 and if the NVRAM 36 indicates that the fuse 20 was blown, yet the BSL 16 can detect the fuse 20 is present, the BSL 16 will set an error signal for the higher level firmware.

Additionally, firmware components dealing with user communication can be modified to support the necessary functionality for communication to the user that the formatter 12 has been tampered with. Further, the configuration page of the printer can be modified to provide an indication that the formatter 12 has been tampered with. This indication should be coded so that the user does not necessarily know the information is being communicated. If possible, the printer will contact a source over the internet and reported that the formatter 12 has been tampered with.

The foregoing discussion discloses and describes exemplary embodiments of the present invention. Other embodiments and various changes, modifications and variations can be made therein without departing from the spirit and scope of the invention as defined in the following claims.

What is claimed is:

1. A formatter in a printer, said formatter comprising:
   a disabler circuit, the disabler circuit including:
      a switch electrically coupled to an input voltage and ground;
      a fuse electrically coupled in series with the switch between the input voltage and ground; and
      a resistor electrically coupled in parallel with the switch and in series with the fuse between the input voltage and ground, wherein if the switch is off, then current flows from the input voltage to ground through the resistor and the fuse, and the current is too small to blow the fuse, and wherein if the switch is on, then current flows from the input voltage to ground through the switch and the fuse, and the current is large enough to blow the fuse;
   an application specific integrated circuit (ASIC), the application specific integrated circuit connected in series with the switch and the fuse; and
   a memory, the memory coupled to the application specific integrated circuit and capable of storing a value indicating that the fuse is blown, wherein the formatter will write the value into the memory indicating that the fuse has been blown.

2. The formatter according to claim 1 wherein a blown fuse indicates that a duplexing function of the printer is disabled.

3. The formatter according to claim 2 wherein the formatter is electrically initialized and managed by a boot strap loader.

4. The formatter according to claim 3 wherein the boot strap loader monitors the circuit to determine whether the blown fuse has been replaced with a new fuse, said boot strap loader generating an error signal if the new fuse is detected.

5. The formatter according to claim 4 wherein the boot strap loader initiates a process by the circuit of blowing the new fuse if the new fuse is detected.

6. The formatter according to claim 3 wherein the boot strap loader accesses the memory to determine whether the blown fuse has been replaced.

7. The formatter according to claim 6 further comprising an input inverter and an output inverter electrically coupled to the switch, said input inverter configured to invert a switch signal and the output inverter configured to invert an output signal.

8. The formatter according to claim 1 wherein the switch is a field effect transistor switch.

9. The formatter according to claim 1 wherein the memory is a non-volatile random access memory.

10. A formatter for disabling a duplexing function of a printer, said formatter comprising:
   a disabler circuit, the disabler circuit including:
      an input inverter electrically coupled to a port of an input/output application specific integrated circuit;
      a field effect transistor switch including a gate terminal electrically coupled to an output of the input inverter;
      a fuse electrically coupled in series with the switch between a voltage source and ground;

a resistor electrically coupled in parallel with the switch and in series with the fuse between the voltage source and ground; and an output inverter electrically coupled to a drain terminal of the field effect transistor switch, wherein if the field effect transistor switch is off then current flows from the input voltage to ground through the resistor and the fuse, and the current is too small to blow the fuse, and wherein if the switch is on, then current flows from input voltage to ground through the switch and the fuse, and the current is large enough to blow the fuse, and wherein if the fuse is blown an output signal is low to indicate the duplexing function should be disabled; and a memory, the memory coupled to the application specific integrated circuit and capable of storing a value indicating that the fuse is blown, wherein the formatter will write the value into the memory indicating that the fuse has been blown.

11. The formatter according to claim 10 wherein the formatter is initialized and managed by a boot strap loader.

12. The formatter according to claim 11 wherein the boot strap loader monitors the circuit to determine whether the blown fuse has been replaced with a new fuse, said boot strap loader generating an error signal if the new fuse is detected.

13. The formatter according to claim 12 wherein the boot strap loader initiates a process by the circuit of blowing the new fuse if the new fuse is detected.

14. The formatter according to claim 11 wherein the boot strap loader accesses the memory storing the value indicating that the fuse has been blown to determine whether the blown fuse has been replaced.

15. A printer, comprising:
a formatter, the formatter including:
a disabler circuit, said disabler circuit including:
a switch electrically coupled to an input voltage and ground;
a fuse electrically coupled in series with the switch between the input voltage and ground; and
a resistor electrically coupled in parallel with the switch and in series with the fuse between the input voltage and ground;
an application specific integrated circuit (ASIC), the application specific integrated circuit connected in series with the switch and the fuse; and
a memory, the memory coupled to the application specific integrated circuit and capable of storing a value indicating that the fuse is blown, wherein the formatter will write the value into the memory indicating that the fuse has been blown; and
a boot strap loader coupled to the formatter, wherein the boot strap loader monitors the disabler circuit to determine whether a previously blown fuse has been replaced with a new fuse based on the value stored in the memory, the boot strap loader generating an error signal if the new fuse is detected.

16. The formatter according to claim 15 wherein the boot strap loader initiates a process of blowing the new fuse when the new fuse is detected.

* * * * *